United States Patent
Degani et al.

(10) Patent No.: US 7,259,077 B2
(45) Date of Patent: Aug. 21, 2007

(54) INTEGRATED PASSIVE DEVICES

(75) Inventors: Yinon Degani, Highland Park, NJ (US); Maureen Y. Lau, Warren, NJ (US); King Lien Tai, Berkeley Heights, NJ (US)

(73) Assignee: Sychip Inc., Plano, TX (US)

( * ) Notice: Subject to any disclaimer, the term of this patent is extended or adjusted under 35 U.S.C. 154(b) by 111 days.

(21) Appl. No.: 10/835,338

(22) Filed: Apr. 29, 2004

(65) Prior Publication Data

US 2005/0253255 A1 Nov. 17, 2005

(51) Int. Cl.
*H01L 21/20* (2006.01)

(52) U.S. Cl. ............... 438/381; 438/238; 438/239

(58) Field of Classification Search ........... 438/381, 438/238, 239
See application file for complete search history.

(56) References Cited

U.S. PATENT DOCUMENTS

| 5,920,764 | A | * | 7/1999 | Hanson et al. ............. 438/4 |
| 2004/0232107 | A1 | * | 11/2004 | Kouma et al. ............. 216/41 |
| 2005/0023590 | A1 | * | 2/2005 | Lian et al. ................ 257/310 |

* cited by examiner

*Primary Examiner*—Long Pham
(74) *Attorney, Agent, or Firm*—Peter V. D. Wilde

(57) ABSTRACT

The specification describes an integrated passive device (IPD) that is formed on a polysilicon substrate. A method for making the IPD is disclosed wherein the polysilicon substrate is produced starting with a single crystal handle wafer, depositing a thick substrate layer of polysilicon on one or both sides of the starting wafer, forming the IPD on one of the polysilicon substrate layers, and removing the handle wafer. In a preferred embodiment the single crystal silicon handle wafer is a silicon wafer rejected from a single crystal silicon wafer production line.

12 Claims, 5 Drawing Sheets

INTEGRATED PASSIVE DEVICES

FIELD OF THE INVENTION

This invention relates to integrated passive devices (IPDs) and more specifically to improved platforms for integrated passive device circuits.

BACKGROUND OF THE INVENTION (Portions of the technical material contained in this section may not be prior art.)

State of the art radio frequency (RF) electrical circuits use large quantities of passive devices. Many of these circuits are used in hand held wireless products. Accordingly, miniaturization of passive devices and passive device circuits is an important goal in RF device technology.

Integration and miniaturization of passive devices on the scale of active silicon devices has not occurred for at least two reasons. One, typical passive devices to date employ different material technologies. But, more fundamentally, the size of many passive devices is a function of the frequency of the device, and thus is inherently relatively large. However, still, there is unrelenting pressure to produce more compact and area efficient IPDs.

Significant advances have been achieved. In may cases these involve surface mount technology (SMT). Small substrates containing large numbers of passive components are routinely produced using surface mount technology.

More recent advances in producing integrated passive device networks involve thin film technology where resistors capacitors and inductors are built as integrated thin film devices on a suitable substrate. See for example U.S. Pat. No. 6,388,290. This advance shows promise as the next generation of integration in passive device technology. However, just as the substrate material and character (pure single crystal silicon) have been key to the success in active device technology, it is becoming evident that the same is true as IPD integration develops. Because passive thin film devices are formed directly on the substrate, electrical interactions between the substrate and the passive devices are of major concern. And although suitable thin film technologies for producing the passive components are available, the ideal substrate for this technology has yet to be found.

SUMMARY OF THE INVENTION

We have discovered a new IPD substrate material with properties that are compatible with highly integrated thin film structures. The new substrate material is polysilicon. Polysilicon layers have been used widely in integrated circuit technology for many years, and the technology of polysilicon, both in terms of properties and thin film deposition techniques, is well known and well developed. However, polysilicon as a substrate material has been largely overlooked until now. It is known that polysilicon can be made with relatively high resistivity, and that a variety of components and devices can be built on polysilicon layers acting as insulating layers. However, our approach melds several known elements in integrated circuit fabrication technology to produce a practical, cost effective, high resistivity, polysilicon substrate as the basic building block for highly integrated IPD circuits. In this approach the polysilicon substrate is self-supporting and can be processed, handled, and packaged. In a preferred embodiment, the polysilicon substrate is produced using a single crystal silicon wafer as a starting material. The polysilicon substrate is made by depositing a thick substrate layer on the silicon wafer, forming a plurality of IPDs at the wafer level, and removing the silicon wafer. Prior art technologies, for example gated diode switches (GDXs), have used polysilicon as "handles" to facilitate processing and handling of single crystal layers or tubs. However, the use of single crystal silicon in this manner is believed to be novel. It is also unobvious, since conventional thought would reject using an expensive material—single crystal silicon—as a sacrificial element in a process. However, we have overcome that thinking by using large silicon wafers that are manufacturing rejects, and are thus of no value as active device substrates. However, they are more than adequate for producing large substrates of polysilicon.

DETAILED DESCRIPTION

Figure 1:
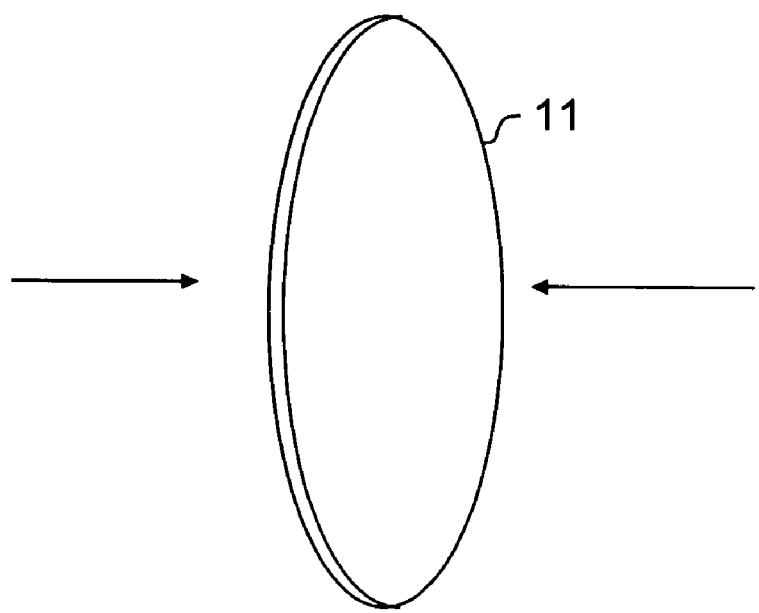
FIG. 1 shows a starting wafer of single crystal silicon.

FIG. 1 is a view of the starting wafer 11. This is a single crystal silicon wafer cut from a boule, and is of a type of wafer used in enormous volume for IC device fabrication worldwide. Silicon wafers are produced in many sizes, but typically the larger the diameter of the wafer, the lower the potential device cost. Currently, silicon wafers are available in diameters up to twelve inches. With twelve inch wafers state of the art, that size will be used as the example in the following description, it being understood that smaller wafers, for example 6" or 8", are also useful.

In a wafer production facility, after sawing and polishing the wafers, each wafer is subjected to quality control, where the wafer is measured for conformity to rigid standards for physical size and electrical properties. Typically wafers with chips or scratches will be rejected. Wafers that have excessive or non-uniform conductivity are also rejected. In many cases the rejected wafers are scrapped, and sometimes referred to as "junk wafers". In this description, and in the claims that follow, a "refuse" wafer includes wafers that are cut from a boule, measured by one or more physical or electrical tests, and rejected for failing a test. Refuse wafers have relatively low commercial value. Some may be recycled. Some may be repaired. For example, some wafers are rejected for defects that occur during processing. These wafers have the potential to be polished to remove the defective structure, and used for processing. Such wafers are also defined as refuse wafers. A refuse wafer may be expected to have a value of less than 50%, and more typically, less than 10%, of the value of an acceptable wafer.

According to one aspect of the invention, a single crystal silicon wafer is used as a handle wafer to produce a polysilicon wafer. It should be understood that while a refuse wafer may be the wafer of choice for economic reasons, any suitable single crystal silicon wafer may be used. In this process, the single crystal wafer is sacrificial. As a handle wafer, the single crystal wafer has important attributes. Even though physically thin (e.g. 200-500 microns), it is relatively robust physically, and can be handled and processed. It is very flat over a large area. It has a highly polished uniformly smooth surface. And it is compatible with silicon wafer fabrication processes and tools.

Figure 2:
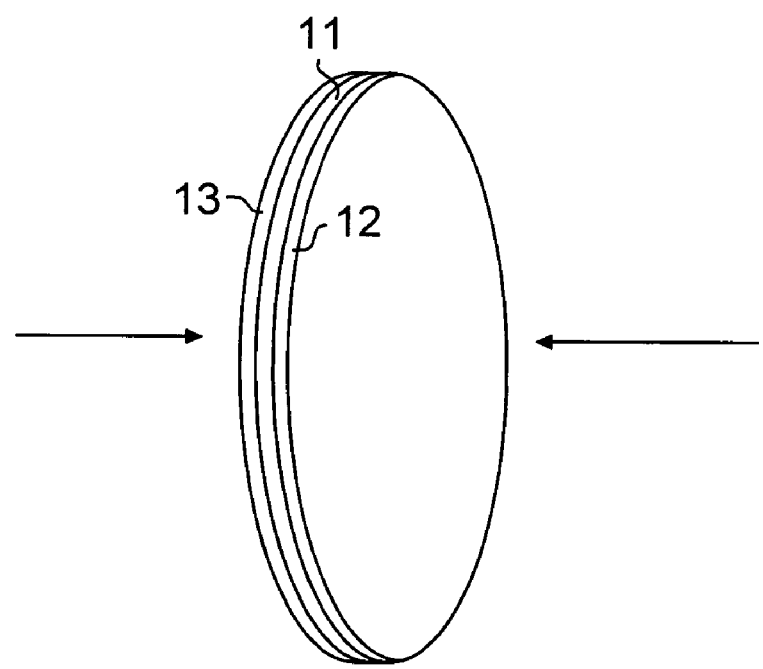
FIG. 2 shows the starting wafer with polysilicon deposited.

Using the silicon wafer as a substrate wafer, thick polysilicon layers 12 and 13 are deposited on both sides of wafer 11 as shown in FIG. 2. Alternatively, polysilicon may be deposited on one side only. However, the polysilicon layer destined for use as an IPD substrate needs to be relatively thick, for example at least 50 microns, and preferably 100-300 microns. We have found that layers with this thickness, when deposited on a single crystal substrate, contain high stress, and tend to physically distort. Since planarity is desirable for the IPD process of the invention, significant distortion of the substrate is preferably avoided. We have found that by depositing polysilicon on both sides of the single crystal wafer, stresses are equalized. Accordingly, layers preferably (but not necessarily) of equal thickness are formed as shown in FIG. 2. The resulting wafer is relatively thick, and very robust. To further reduce the stress in the composite wafer, the composite wafer may be annealed. However, care in annealing should be exercised, since annealing encourages grain growth, and fine grain structures are desired, for reasons that will become evident from the discussion below.

The final substrate product desired is a polysilicon substrate, without the single crystal wafer, as will be described below. However, even though the composite wafer shown in FIG. 2 is not the final product (i.e., the single crystal wafer will be absent in the final product), it is convenient to perform at least some of the processing on the composite wafer. The processed wafer may then be thinned in a later step to remove one of the polysilicon layers, and the single crystal layer, leaving the polysilicon layer to serve as the final IPD substrate.

An important attribute of an intrinsic polysilicon substrate is high resistivity. Polysilicon is characterized by a grain structure, wherein the layer or body is comprised of many grains of silicon, separated by grain boundaries. The grain boundaries behave electrically as recombination centers, drastically reducing the lifetime of free carriers in the body. In terms of electrical behavior, this characteristic separates polysilicon from single crystal silicon. While single crystal silicon is a semiconductor, the large number of grain boundaries in polysilicon make it, in an undoped or intrinsic state, an insulator. The resistivity of polysilicon is a partly a function of the number of grain boundaries, or the fineness of the grain structure. Thus very fine grain polysilicon may have very high resistivity. Polysilicon may easily be produced with a resistivity of more than 10 KOhm-cm. In the context of the invention, resistivity values of more than 0.1 KOhm-cm, and preferably more than 1 KOhm-cm are desired.

The method used to produce the polysilicon layers is preferably CVD (LPCVD). This method, and CVD equipment for implementing the method, are widely used in industry. Briefly, the method commonly used for CVD polysilicon involves the pyrolysis of silane at modest temperatures, for example, 550-650° C. Polysilicon is used in nearly every MOS transistor made, and is thus one of the most common industrial materials known. Obviously, the electrical and physical properties of polysilicon are also well known. Though it is intrinsically highly resistive, as just described, it is typically processed by ion implantation to reduce the resistivity for IC applications. It is rarely used in its intrinsic form. Thick, wide-area, polysilicon layers have also been used in solar cells, or photocells. Here again, the polysilicon layers are typically implanted with ions to form diode structures.

In the application to be described below, the polysilicon substrate is used in its intrinsic state, and uniform high resistivity across the substrate is a desired property.

Since the technology of CVD polysilicon is so well developed, CVD is the preferred choice for forming the polysilicon layers 12 and 13. However, other methods may be found useful. For example, methods are known for e-beam evaporation of polysilicon. Any suitable alternative for forming a thick, wide area, low resistivity, polysilicon substrate layer is within the scope of the invention.

Figure 3:
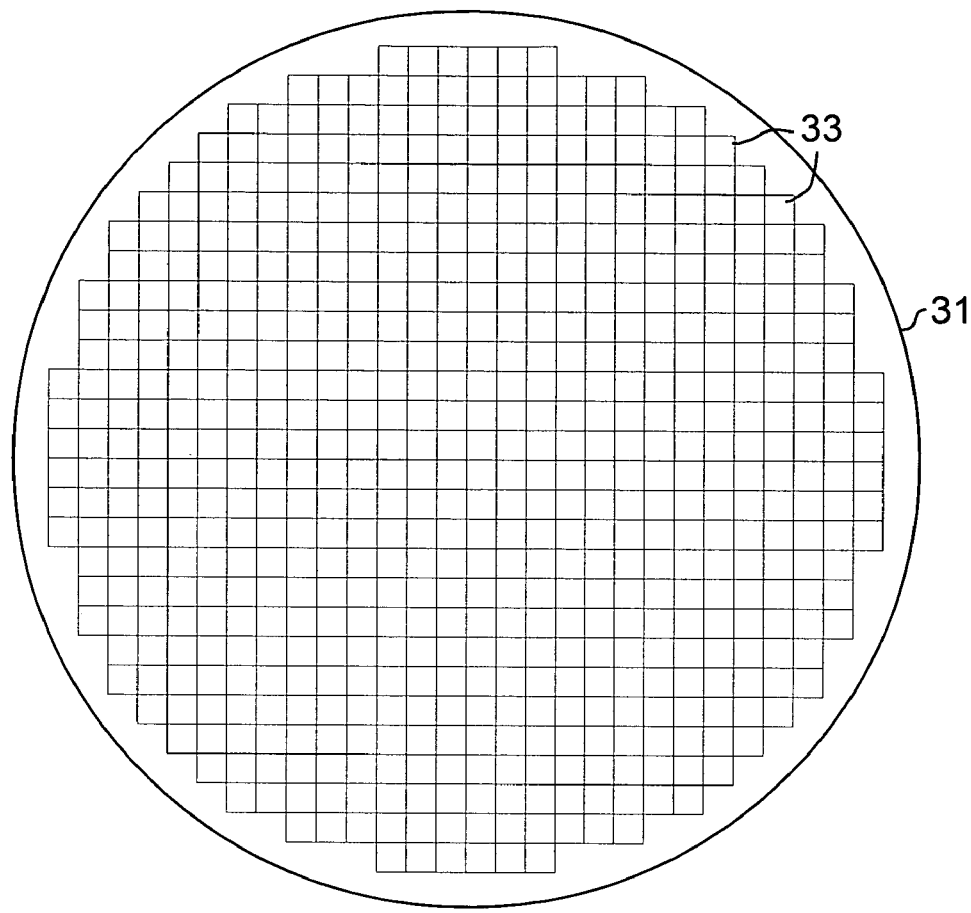
FIG. 3 is a view of the polysilicon wafer of the invention showing over 500 IPD sites for building thin film IPDs.

The IPD production approach described here is aimed at wafer scale device fabrication. In this approach, a large number of finished, or nearly finished, devices are produced on the polysilicon wafer. After fabrication is essentially complete, the wafer is diced into IPD devices. As the size of wafers increases, and IPD device size shrinks, wafer level fabrication becomes ever more attractive. FIG. 3 shows a twelve inch wafer 31, which is capable of providing more than 500 device sites 33. (For simplicity, the wafer flat is not shown.) Each site is approximately a centimeter square, easily large enough to accommodate an IPD.

Figure 4:
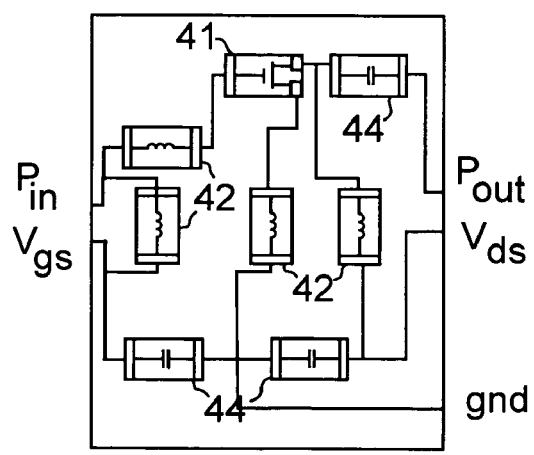
FIG. 4 is a schematic section view of a typical IPD showing conventional SMT components mounted on a conventional substrate.

The effectiveness of wafer scale fabrication can be multiplied using thin film fabrication approaches for forming the passive devices. A common prior art approach, even at the wafer level, is to mount and attach discrete passive elements to the wafer substrate. Typically this is done using surface mount technology (SMT). FIG. 4 shows this method as applied to the IPD circuit illustrated in FIG. 3 of U.S. Pat. No. 6,388,290, referenced earlier. This circuit is not strictly an IPD because it contains an active element, i.e. MOS transistor 41. However, for reasons that will become apparent below, it is a useful illustration. The circuit may be considered a hybrid circuit having an active portion and a passive portion. Here we will be concerned mainly with the passive portion, i.e. the portion that contains four inductors 42 and three capacitors 44. As a matter of choice, that portion could be produced as an IPD. Although the circuit of FIG. 3 is useful here, and below, as a vehicle to illustrate the technology of the invention, a wide variety of circuits may be made using the invention. For another example, and one that may be more demanding from a high-Q standpoint, see Proceedings 1994 IEEE MULTI-CHIP MODULE CONFERENCE MCMC-94, PAGES 15-19, incorporated herein by reference.

Thin film passive elements may be formed by a variety of thin film techniques. These techniques are well developed and the specifics need not be reiterated here. See for example U.S. Pat. No. 6,075,691, issued Jun. 13, 2000, and U.S. Pat. No. 6,005,197, issued Dec. 21, 1999. The latter patent describes a multi-layer structure for PCBs, which could easily be adapted for the application described here. A convenient way of defining a thin film passive device is a passive device that is formed on a substrate using one or more layers, typically a plurality of layers, deposited on the substrate.

Figure 5:
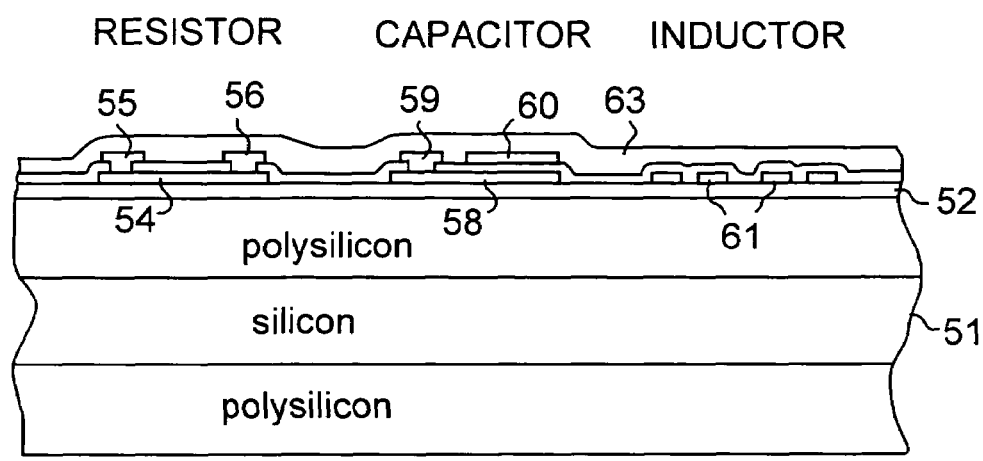
FIG. 5 is a schematic view of a thin film approach to IPD fabrication on one of the sites of the substrate of FIG. 3.

Thin film methods for producing single passive elements or combinations of interconnected passive elements are generically represented by FIG. 5, wherein the polysilicon substrate is shown at 51, with a grown oxide layer 52. Resistor body 54, formed from first level metal, has contacts 55 and 56, and lower capacitor plate 58, with contact 59, both comprise buried levels. Upper capacitor plate 60, and inductor spiral 61, are formed last, with contacts not shown. The structure is protected with polyimide layer 63.

Figure 6:
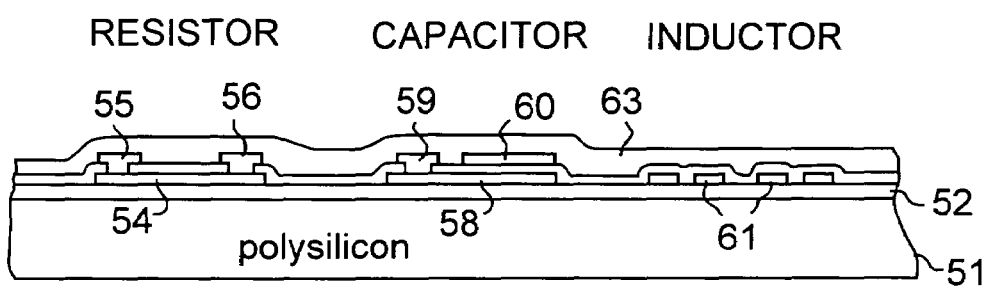
FIG. 6 is a view of the fabricated IPD after removal of the single crystal silicon handle.

The three-layer substrate structure 51 of FIG. 5 is very thick, which reduces the risk of fracture and other damage during processing. After fabrication of the passive circuit elements, and completion of the IPD, the substrate 51 is thinned to remove the lower polysilicon layer, and the single crystal silicon layer. The final IPD structure is shown in FIG. 6. The preferred thinning step uses chemical mechanical polishing. This well known process combines abrasive polishing with chemical etching. KOH or a suitable alternative etchant is used in the abrasive slurry. The composite wafer is thinned to where only the top polysilicon layer, or a portion of the top polysilicon layer, remains. Removing the entire single crystal layer is highly recommended, since that layer is relatively conductive. A goal of the invention is to provide a highly insulating substrate, which is a favorable platform for IPDs.

Because the single crystal layer (as well as the added polysilicon layer) provides an effective handle for the polysilicon top layer (the IPD layer), the IPD layer may be relatively thin initially. It is not uncommon in IC technology today to thin the starting wafer after wafer fabrication is complete. In many of these cases the substrate is deliberately made thick to survive handling and processing, with a thinning step later in the process to reduce the device profile. In the method described here, the thickness of the IPD layer may be initially the same approximate size as the final substrate thickness. That thickness is preferably 50-200 microns.

Figure 7:
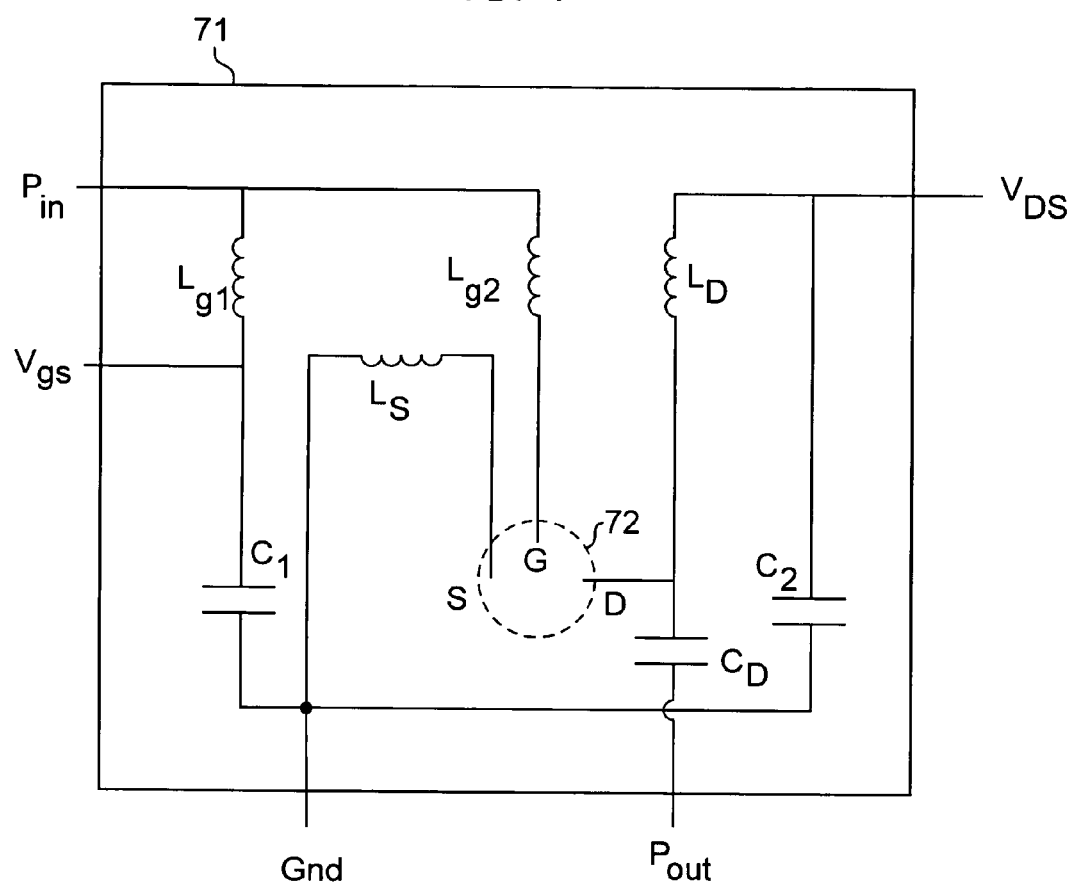
FIG. 7 is a schematic circuit diagram showing an example of an IPD.

The IPD of FIG. 4 is shown implemented according to the invention in FIG. 7. The IPD is formed on one or more of the sites 33 shown in FIG. 3. Polysilicon substrate 71 is shown with thin film inductors $L_{g1}$, $L_{g2}$, $L_S$ and $L_D$, and capacitors $C_1$, $C_2$, and $C_D$. MOS transistor 72 is shown in phantom because, while part of the schematic circuit, it is not formed in the IPD. The circuit layout for FIG. 7 is deliberately changed from that of FIG. 3. This circuit and this layout are for the purpose of illustrating a typical type of circuit having passive components. It is an example of a circuit taken from the prior art referenced earlier. No representation as to its effectiveness is made here.

Figure 8:
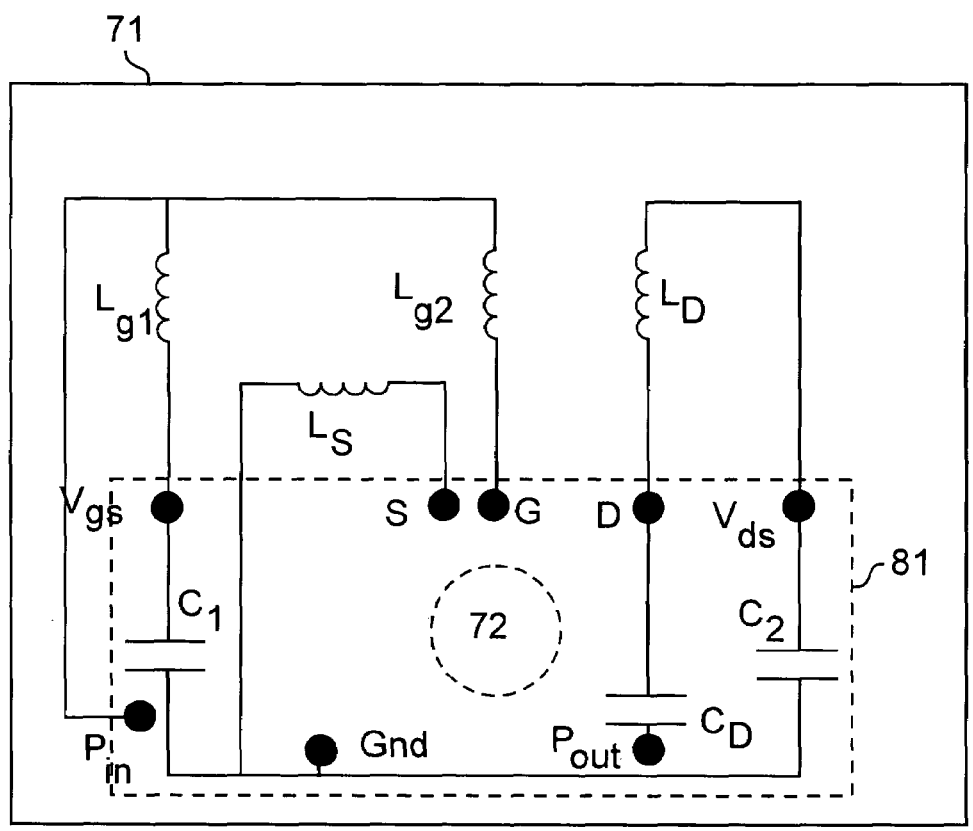
FIG. 8 shows the IPD with an active IC chip mounted on the IPD.

The layout in FIG. 7 is designed with all the inductor elements grouped together. It is known that inductor elements are especially sensitive to ambient conditions, e.g. parasitic signals. This recognition is employed in the design of the active/passive module shown in FIG. 8. The polysilicon substrate 71, with the IPD shown in FIG. 7, has an active IC chip 81 flip-chip mounted over the top of the IPD as shown. Part of the active IC chip is transistor 72. The interconnections in this embodiment are shown as solder bumps for the electrical interconnections S, D, G, $V_{gs}$, $V_{DS}$, $P_{in}$, $P_{out}$, gnd. Off board interconnection sites (not shown) may be provided on the IPD substrate 71. One purpose of the grouping of the inductor devices as shown in FIG. 7 is evident in FIG. 8. The active IC chip is deliberately positioned so as not to overlay the sensitive inductor elements. Thus the stacked substrate arrangement is effectively implemented to save space and provide a compact device module, without compromising the performance of the inductor elements.

It may be appreciated that the subassembly of FIG. 2, i.e. a three-layer composite substrate, may be produced by a substrate manufacturer as a standalone product. A characteristic of that product, as well as the IPD substrates described above, is the planarity of the three layers in the composite.

Various additional modifications of this invention will occur to those skilled in the art. All deviations from the specific teachings of this specification that basically rely on the principles and their equivalents through which the art has been advanced are properly considered within the scope of the invention as described and claimed.

The invention claimed is:

1. A method for fabricating an integrated passive device (IPD) comprising the steps of:
    a. providing a polysilicon wafer substrate, the polysilicon wafer substrate having a resistivity of more than 0.1 Kohm-cm., a thickness areater than 50 microns, and a plurality of IPD sites,
    b. forming a plurality of thin film passive devices on the IPD sites, and
    c. interconnecting the plurality of thin film passive devices on the polysilicon wafer substrate.

2. The method of claim 1 wherein the polysilicon wafer substrate comprises a polysilicon substrate layer on a single crystal silicon wafer.

3. The method of claim 1 wherein the polysilicon wafer substrate comprises two polysilicon layers with a single crystal wafer between the two polysilicon layers.

4. The method of claim 2 wherein the polysilicon substrate layer has a thickness greater than 200 microns.

5. The method of claim 2 wherein the polysilicon substrate layer is deposited on the single crystal silicon wafer.

6. The method of claim 5 wherein the polysilicon substrate layer is deposited on the single crystal silicon wafer using CVD.

7. The method of claim 2 wherein the single crystal silicon wafer is a refuse wafer.

8. The method of claim 7 wherein the single crystal silicon wafer has a diameter of at least 8 inches.

9. The method of claim 1 further including mounting an active IC chip on top of the IPD.

10. The method of claim 1 wherein the thin film passive device comprises one or more inductors.

11. The method of claim 2 wherein, after step b., the single crystal silicon wafer is removed.

12. A method for fabricating an integrated passive device (IPD) comprising the steps of:
    a. producing a group of silicon wafers,
    b. measuring the electrical and physical properties of each wafer of the group,
    c. selecting a first subgroup of the group for integrated circuit processing,
    d. rejecting a second subgroup of the group,
    e. selecting an IPD wafer from the subgroup,
    f. depositing polysilicon on the IPD wafer to form a silicon wafer polysilicon wafer combination, the polysilicon wafer of the combination having a thickness greater than 50 microns,
    g. removing the silicon wafer from the silicon wafer polysilicon combination leaving a polysilicon wafer,
    h. forming a plurality of thin film passive devices on the polysilicon wafer, and
    i. interconnecting the plurality of thin film passive devices on the polysilicon wafer.

* * * * *